(12) United States Patent
Oda

(10) Patent No.: US 6,591,087 B1
(45) Date of Patent: Jul. 8, 2003

(54) RADIO COMMUNICATION APPARATUS

(75) Inventor: Toshiyuki Oda, Tokyo (JP)

(73) Assignee: NEC Corporation, Tokyo (JP)

( * ) Notice: Subject to any disclaimer, the term of this patent is extended or adjusted under 35 U.S.C. 154(b) by 272 days.

(21) Appl. No.: 09/689,709

(22) Filed: Oct. 13, 2000

(30) Foreign Application Priority Data

Oct. 13, 1999 (JP) .......................................... 11-290376

(51) Int. Cl.[7] ................................................. H04B 1/44
(52) U.S. Cl. ...................... 455/78; 455/127; 455/552; 455/553; 330/124 R; 330/295
(58) Field of Search ................................. 455/127, 552, 455/553, 78; 330/124 R, 295

(56) References Cited

U.S. PATENT DOCUMENTS

| | | | | |
|---|---|---|---|---|
| 3,581,223 A | * | 5/1971 | Armstrong | 331/107 G |
| 4,503,405 A | * | 3/1985 | Jordan et al. | 332/123 |
| 5,304,943 A | * | 4/1994 | Koontz | 330/51 |

FOREIGN PATENT DOCUMENTS

| | | |
|---|---|---|
| GB | 2219702 A | 12/1989 |
| JP | 61-68505 | 5/1986 |
| JP | 63-156431 | 6/1988 |
| JP | 11-17561 | 1/1999 |

* cited by examiner

*Primary Examiner*—William Trost
*Assistant Examiner*—Danh C Le
(74) *Attorney, Agent, or Firm*—McGinn & Gibb, PLLC

(57) ABSTRACT

A radio communication apparatus is provided which is capable of carrying out stable radio communication by preventing the phase rotation at the output end by addition of a phase rotation compensation circuit, even when using the apparatus with a bypass circuit. In a bypass circuit which bypasses the transmission final stage amplifier 6, a phase rotation compensating circuit, comprised of a variable capacitance capacitor 9 and a coil 10, and whose cutoff frequency can be adjustable by an adjustment voltage, is inserted in the middle of the bypass route. In order to absorb the individual variation of the transmission final stage amplifiers 6, the phase rotations for the individual amplifiers are measured and stored in the EEPROM 17. Consequently, the present apparatus can be applied to use in the case of changing the gain of the transmission final stage amplifier 6.

20 Claims, 7 Drawing Sheets

RADIO COMMUNICATION APPARATUS

BACKGROUND OF THE INVENTION

1. Field of the Invention

The present invention relates to a radio communication apparatus and a send and receive control system for using the same, and more particularly relates to a send and receive control system to be used in a circuit in which a power amplifier is bypassed or a circuit in which the power source of the power amplifier is controlled to be ON or OFF.

2. Background Art

Generally, in a transmitter installed in a mobile machine, the transmission output power of the transmitter is controlled by the control signal from the base station. In this type of transmitting output power control system, when carrying out the control of the transmission output power with a wide dynamic range with linearity, a reduction of a current consumption efficiency at the time of low output transmission requires a reduction of the current consumption.

One of the measures for reducing the current consumption in the transmission output control is realized by a variable control of the gate bias by use of a gate bias variable circuit so as to obtain an optimum DC characteristic (idle current) for the transmission output.

However, since it is not possible to squeeze the DC characteristic infinitely to preserve the linearity of the power amplifier, there is naturally a limit in the reduction of the current consumption at the low output transmission, and it becomes impossible to further reduce the current consumption when the output level is below the prescribed low level.

A first method for solving the above described problem has been proposed by the present inventor by bypassing the power amplifier, since amplification of the signal is not necessary when the transmission output is low.

In a phase deviation modulation system such as the CDMA (Code Division Multiple Access) radio communication system, which is used in the digital radio communication systems, data is transmitted by allocating the data in each phase of the carrier wave. For example, in a QPSK (Quadriphase Phase Shift Keying) system, each data is transmitted by allocating to it as a symbol on the I-Q plane, such that the data "00" is allocated the phase $\pi/4$, the data "10" is allocated the phase $3\pi/4$, the data "11" is allocated the phase $5\pi/4$, and the data "01" is allocated the phase $7\pi/4$.

In this case, the phase of each datum is shifted by $\pi/4$, and it is possible rotate the entire phase, that is, the standard phase by the angle of $\phi$, maintaining each phase difference at $\pi/4$. For example, in interpolated synchronous detection used in the phase deviation modulation system, the standard phase is rotated for each slot provided in the main signal, and the standard phase for each data in the slot is rotated.

However, in the radio communication apparatus with the above-described system, since the amounts of phase variation of a variable gain amplifier varies with the gain when the variable gain amplifier is provided in a modulating portion or in a demodulating portion of an analog circuit portion, and since the relative phase relationship between the input signal and the output signal of the variable gain amplifier is deformed when the gain change is generated, an error in detecting the standard phase based on the pilot signal arises due to the phase change based on the gain variation, which causes a problem of generating a detection error for each switching unit of the gain in the slot.

In order to solve the above described problem, the present inventor has proposed a second method, in which the phase rotation at the amplifier is compensated by the base band signal.

In the above-described conventional radio communication apparatus, in the first method for reducing the current consumption by bypassing the amplifier when the transmission power is small, it is not possible to compensate the phase rotation caused by bypassing the amplifier.

The present inventor has also proposed the second method for reducing the current consumption by compensating the phase rotation at the amplifier by the base band signal.

In the above-described conventional radio communication apparatus, the first method for reducing the current consumption by bypassing the power amplifier when the transmitting power is small is not capable of compensating the phase rotation, because the second method does not include a device to compensate the phase rotation.

The second method which compensates the phase rotation at the amplifier by the base band signal cannot respond to an instantaneous phase change such as the bypass switching.

SUMMARY OF THE INVENTION

The present invention was made to solve the above described problems. It is, therefore, an objective of the present invention to provide a radio communication apparatus capable of bypassing the power amplifier, and comprising a phase compensating circuit disposed in the bypass route for bypassing the power amplifier for compensating the sudden rotation of the phase due to switching the route.

According to the present invention, a radio communication apparatus provided with a power amplifier which can be bypassed comprises: a normal route passing through the power amplifier and a bypass route for bypassing the power amplifier; and a phase compensation circuit disposed in said bypass route for compensating the sudden phase rotation when switching said two routes.

According to the present invention, in the radio communication apparatus, provided with a receiving amplifier whose power source can be universally controlled to be ON or OFF, and which is disposed on a receiving route, the radio communication apparatus comprises a phase compensation circuit, disposed after said receiving amplifier on said receiving route, for compensating for the sudden phase rotation due to the on/off switching of said power source.

According to the present invention, in a send and receive control system, provided with a power amplifier which can be bypassed, the phase compensation circuit for compensating for the sudden phase rotation due to the route switch is disposed in a bypass route for bypassing said power amplifier.

Furthermore, in the send and receive control system, the amount of the phase rotation of said phase compensation circuit can be controlled by a voltage, and the send and receive control system can comprise a memory device for storing a phase adjustment value for said phase compensation device.

That is, in the send and receive control system according to the present invention comprising a circuit which can bypass the amplifier or which can execute the on/off control of the amplifier, although the phase of the output signal is suddenly rotated, this phase rotation of the output signal of this system can be prevented by comprising a phase compensation circuit and by providing in advance the amount of phase change as data in a memory device.

Thereby, compensation of the phase rotation by the phase compensation circuit arising in a circuit which can bypass the amplifier allows preventing the phase rotation and allows stable radio communication.

DETAILED DESCRIPTION OF THE INVENTION

Figure 1:
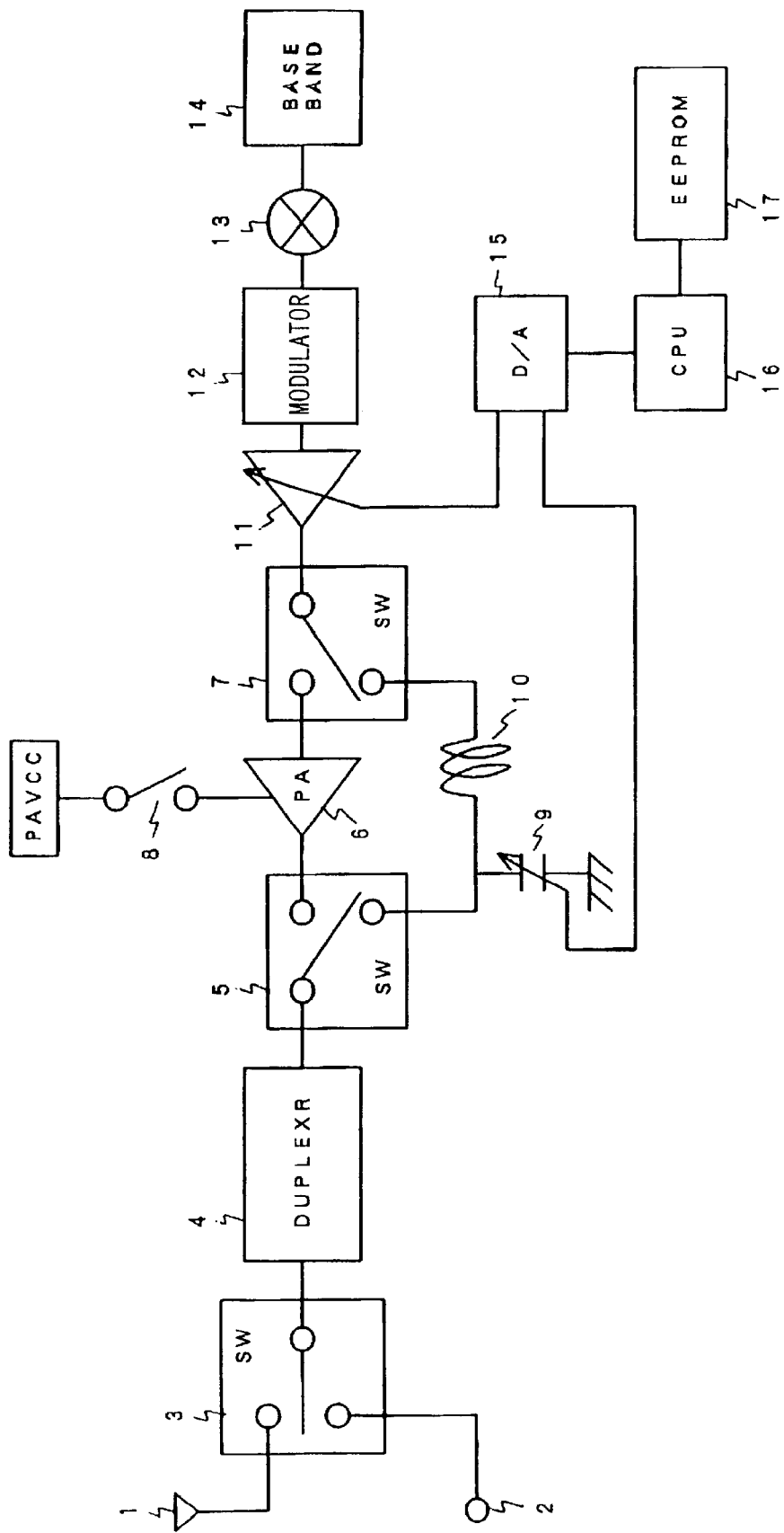
FIG. 1 is a block diagram showing the structure of the radio communication apparatus according to the first embodiment of the present invention.

Hereinafter, the first embodiment of the present invention is described with reference to the attached drawings. FIG. 1 is a block diagram showing the structure of the radio communication apparatus according to the first embodiment of the present invention. In FIG. 1, the radio communication apparatus according to the first embodiment of the present invention comprises a transmitting and receiving antenna 1, an external terminal 2, a switch (SW) 3, a Duplexer 4 which is a filter for separating transmitting signals from receiving signals, a switch (SW) 5 for selecting for selecting one of a route (hereinafter called a PA route) passing the transmission final stage amplifier (PA: POWER ART) 6 or a bypass route, a transmission final stage amplifier 6, a switch (SW)7 for switching the PA route and the bypass route, a switch (SW) 8 for controlling the ON/OFF state of the power source (PAVCC) of the transmission final stage amplifier 6, a variable capacitance capacitor 9, a coil 10, a AGC (Auto Gain Control) amplifier 11, a modulator 12, a mixer 13, a base band generator 14, a D/A (digital/analog) converter 15, a CPU (Central Processing Unit) 16, and an EEPROM (Electrically Erasable and Programmable Read Only Memory) 17.

Here, the variable capacitance capacitor 9 and the coil 10 form the phase compensation circuit and the coil 10 is a concentrated constant or a strip line.

In the first embodiment of the present invention, in the above-described circuit bypassing the transmission final stage amplifier 6, the filter, capable of controlling the cut-off frequency by a voltage, is inserted in the middle of the bypass route. This filter forms a phase compensation circuit since the phase can be rotated by the cut-off frequency.

The phase compensation circuit is constituted by an RC filter or an LC filter, and the amount of the phase rotation can be varied by using a capacitor such as a variable capacitance capacitor 9 whose capacitance is variable by controlling the voltage.

In order to initialize the respective transmission final stage amplifiers 6, the amount of rotation of each amplifier 6 is measured in advance and the measured result is stored in EEPROM 17, and it becomes possible to provide for the case of using the transmission final stage amplifier 6 while changing its gain.

Figure 2:
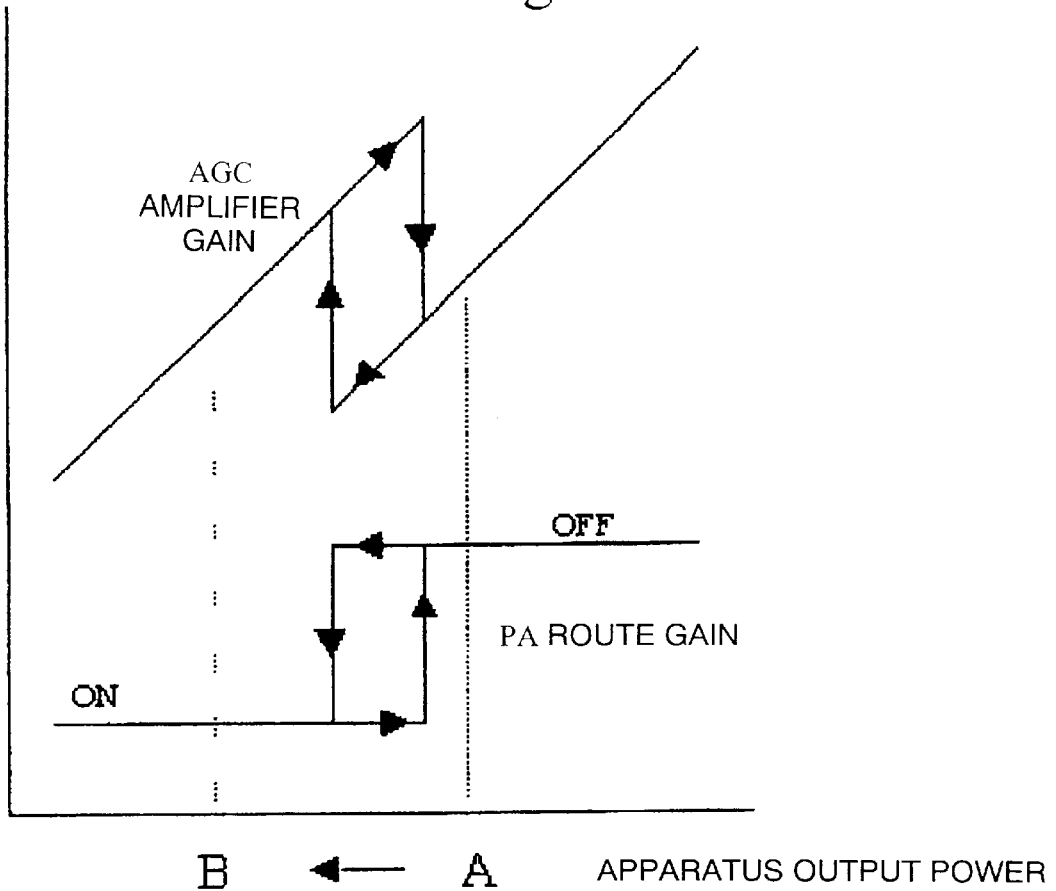
FIG. 2 is a diagram showing the relationship between the gain of the AGC amplifier and the gain of the PA route for the device output power according to the first embodiment of the present invention.
Figure 3:
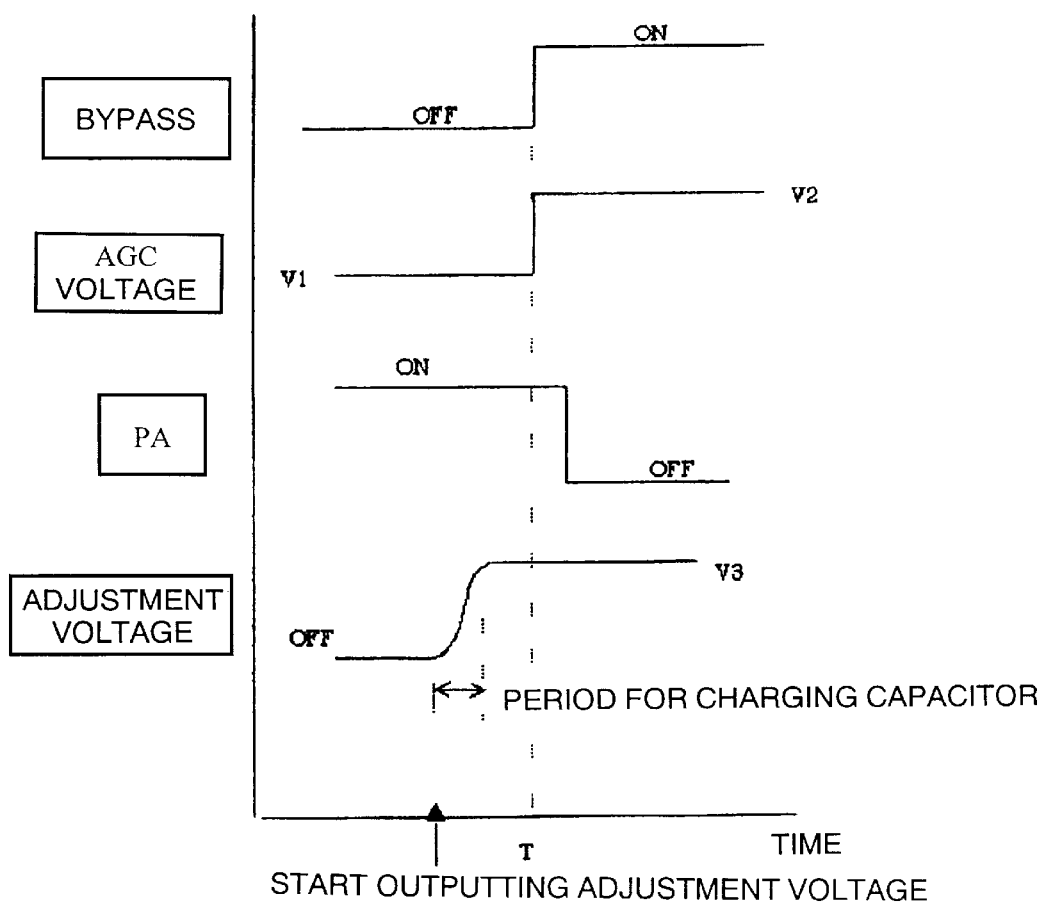
FIG. 3 is a diagram showing the change of the voltage of the device at the time of switching the route (A→B) according to the first embodiment of the present invention.
Figure 4:
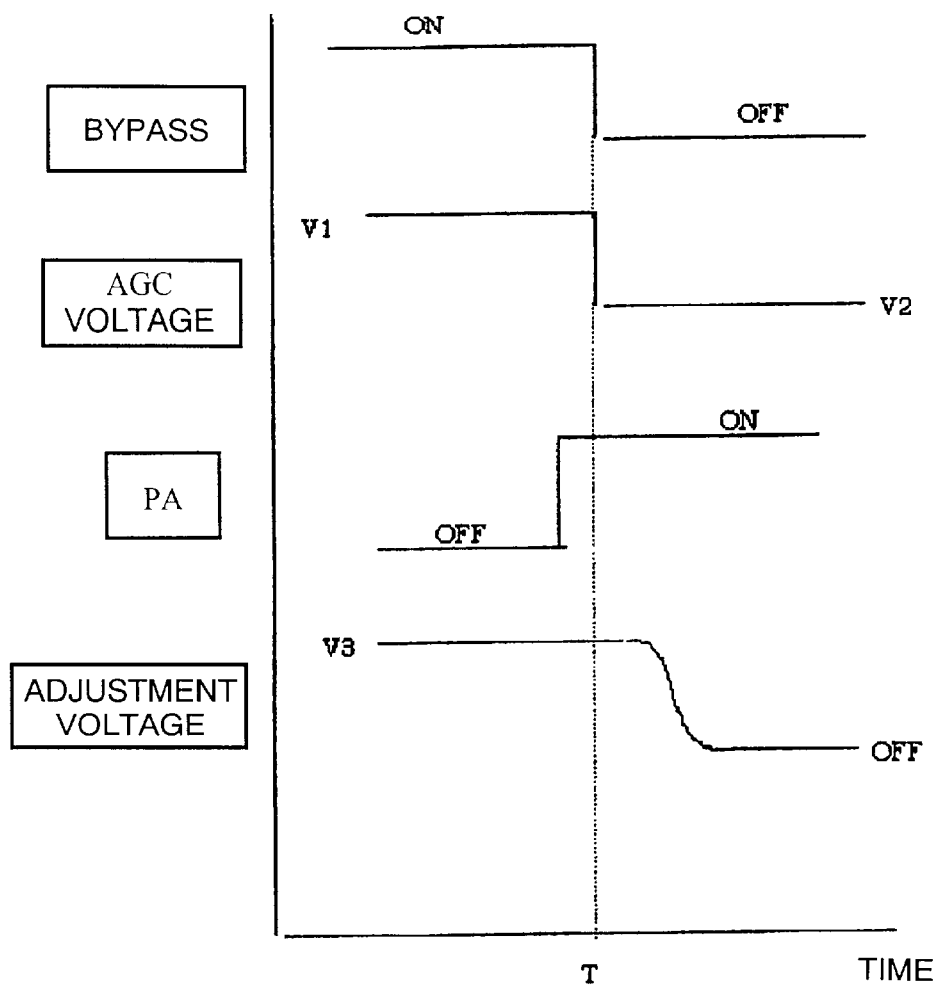
FIG. 4 is a diagram showing the change of the voltage of the device at the time of switching the route (B→A) according to the first embodiment of the present invention.
Figure 5:
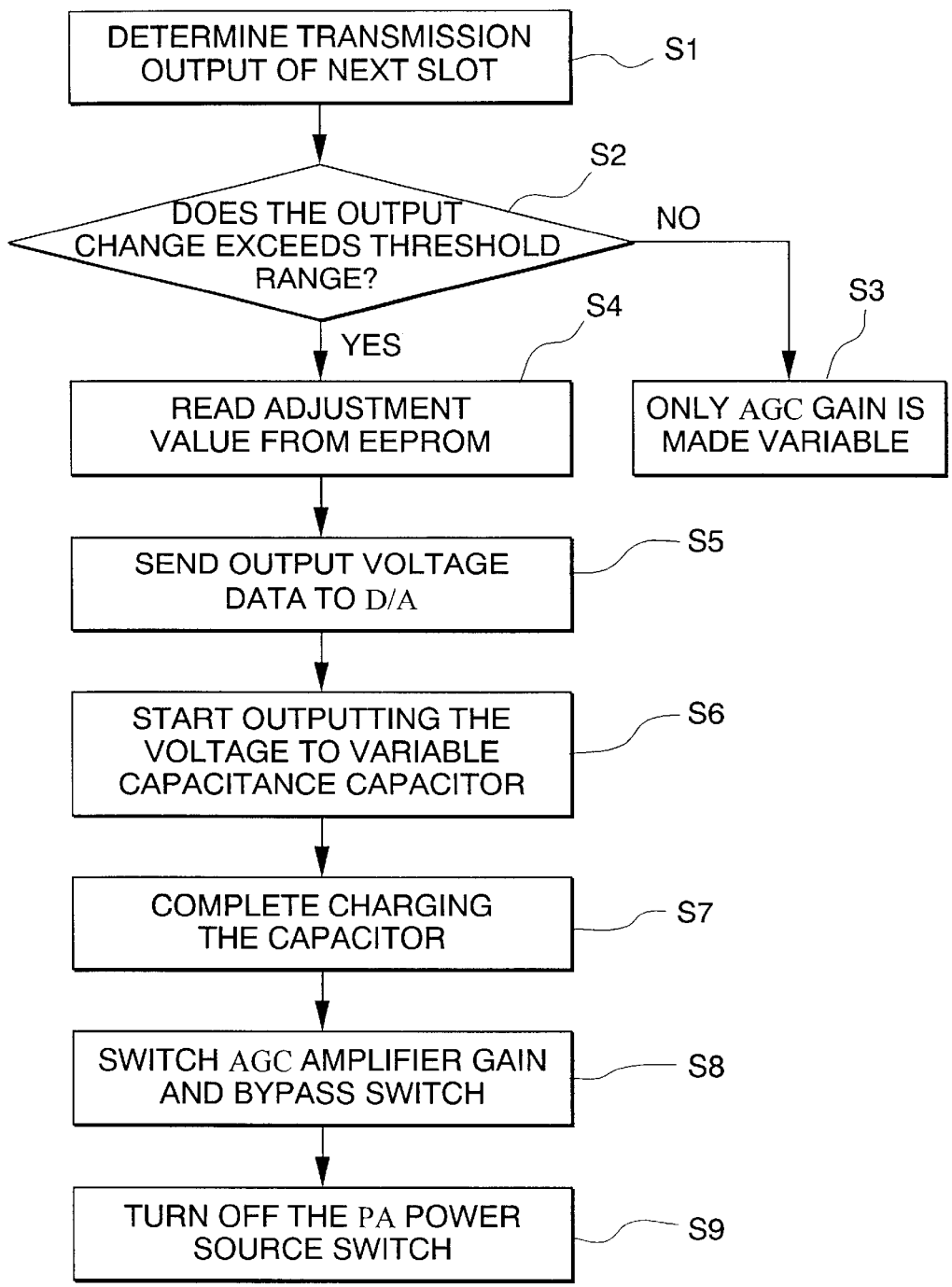
FIG. 5 is a flow-chart showing the operation of the radio communication apparatus according to the first embodiment of the present invention.

FIG. 2 is a diagram showing the relationship between the gain of the AGC amplifier and the gain of the PA route for the output power of the device according to the first embodiment of the present invention, FIG. 3 is a diagram showing the change of the voltage of the device at the time of switching the route (A→B) according to the first embodiment of the present invention, and FIG. 4 is a diagram showing the change of the voltage of the device at the time of switching the route (B→A) according to the first embodiment of the present invention, and FIG. 5 is a flow-chart showing the operation of the radio communication apparatus according to the first embodiment of the present invention. The operation of the first embodiment of the present invention will be described with reference to these FIGS. 2–5.

In the first embodiment of the present invention, an adjustment voltage is controlled so as to provide the same phase in both the PA route and the bypass route when the switches 5 and 7 are switched, and once the adjustment voltage is determined, the thus determined adjustment voltage is stored in the EEPROM 17.

In the practical operation of the first embodiment, the gain for the AGC amplifier 11 and the gain of the PA route change as shown in FIG. 2. In this case, a hysteresis is provided in order to avoid the gain change at short cycles.

When the output power is changed from A→B, switching of the bypass circuit takes place. When it is assumed that switching occurs at a time T, the operations of the switches 5 and 7 near switch 8 for switching the bypass, the control voltage of the AGC amplifier 11, the power source of the transmission final stage amplifier 6, and the control voltage for the transmission final stage amplifier are shown in FIG. 3. The power source of the transmission final stage amplifier 6 is switched after the switches 5 and 7 are switched.

Considering the charging time for the variable capacitance capacitor 6, the CPU 16 outputs the adjustment voltage a certain time before the bypass switching is executed by the switches 5 and 7.

In contrast, when the output power is switched from B→A, the operations are executed as shown in FIG. 4. That is, the power source of the transmission final! stage amplifier 6 is turned on before the bypass is switched by the switches 5 and 7, and after the bypass is switched, the adjustment voltage is turned OFF.

That is, the CPU 16 determines the transmission output of the next slot (step S1 in FIG. 5), and when the output varies within a threshold range (step S2 in FIG. 5), only the gain of the AGC amplifier 11 is varied (step S3 in FIG. 5).

When it is detected that the output varies exceeding the threshold range (step S2 in FIG. 5), the CPU 16 reads the adjustment value from the EEPROM 17 (step S4 in FIG. 5), and sends the output voltage data to the D/A converter 15 (step S5 in FIG. 5).

Thereafter, the CPU 16 begins to output the voltage to the variable capacitance capacitor 9 (step S6 in FIG. 5), and after charging the variable capacitance capacitor 9 (step S7 in FIG. 5), the CPU 16 switches the gain of the AGC amplifier 11, switches the bypass by the switches 5 and 7 (step S8 in FIG. 5), and turn OFF the power source of the transmission final stage amplifier 6 by switching the switch 8 (step S9 in FIG. 5).

When the phase of the transmitting wave changes rapidly, a demodulation error will arise at the receiving end, so that the bit error rate is degraded. In addition, if the demodulation error occurs during the synchronization confirmation procedure, the synchronization confirmation may be failed, and in the worst case, the connection may be cut.

The adoption of the above-described constitution and the operation, the phase rotation of the device output can be prevented even when the bypass circuit is used with phase compensation in the bypass route, and stable radio communication is achieved.

Figure 6:
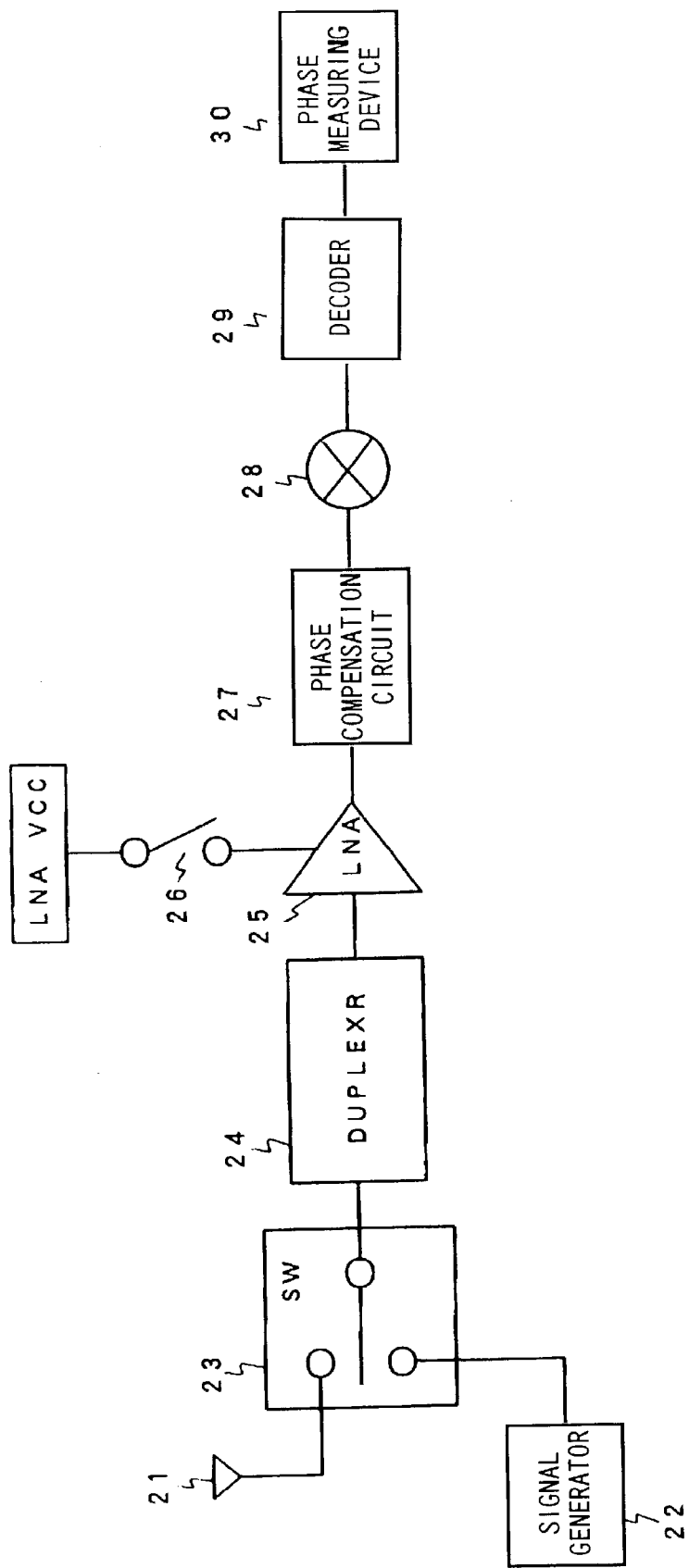
FIG. 6 is a block diagram showing the radio communication apparatus according to the second embodiment of the present invention.

FIG. 6 is a block diagram showing the structure of the radio communication apparatus according to the second embodiment of the present invention. In FIG. 6, the radio communication apparatus according to the second embodiment of the present invention comprises a transmitting and receiving antenna 21, a signal generator 22, a switching switch (SW) 23, Duplexer 24 which is a filter for separating the transmitting and receiving signals, a LNA (Low Noise AMP) 25, a switch (SW) 26 for controlling ON/OFF of the power source (LNAVCC) of the LNA 25, a phase compensating circuit 27, a mixer 28, a demodulator 29, and a phase measuring device 30.

The radio communication apparatus according to the second embodiment of the present invention receives the receiving LNA using the receiving LNA 25 while executing the ON/OFF control of the receiving LNA 25, in order to prevent degradation of signal waveforms by saturation of the AMP at the time of the high input state. In this case, the phase changes suddenly at the time of switching the ON/OFF state of the LNA 25.

The radio communication apparatus according to the second embodiment prevents the phase rotation by inserting the phase compensation circuit 27 at the subsequent stage of the LNA 25. Although the operation of the radio communication apparatus according to the second embodiment is the same as that of the first embodiment, the adjusting method in advance in the second embodiment differs from that of the first embodiment. In this embodiment, a signal generator 22 is connected to the device as a detecting device and the amount of phase adjustment is determined detecting the phase of the modulated waveform.

Figure 7:
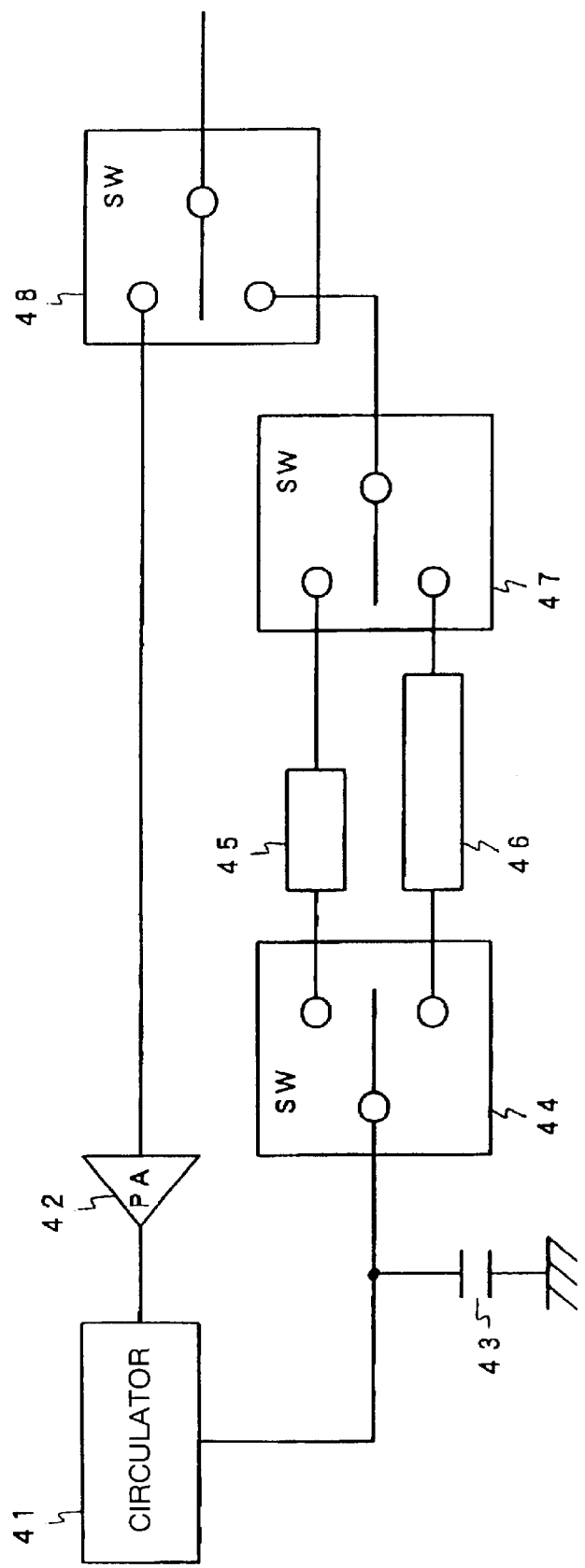
FIG. 7 is a block diagram showing the radio communication apparatus according to the third embodiment of the present invention.

FIG. 7 is a block diagram showing the structure of the radio communication apparatus according to the third embodiment of the present invention. In FIG. 7, only two routes of the radio communication apparatus according to the third embodiments are only illustrated, including a route (hereinafter, called the PA route) passing the transmission final stage amplifier (PA) 42 and the bypass route.

The radio communication apparatus according to the third embodiment comprises a circulator 41, a transmission final stage amplifier 42, a capacitor 43, a switch (SW) 44 for switching a strip line 46, a coil 45 or a strip line 46, a switch (SW)47 for switching the output of the switch 48 to the coil 45 or the strip line 46, and a switch (SW) 48 for switching the PA route or the bypass route.

In the radio communication apparatus according to the third embodiment of the present invention, since there is no individual variation of the transmission final stage amplifier and since only one gain is used, the capacitor 43 has a fixed capacitance, the cut-off frequency, that is, the phase rotation can be selected by selecting the coil 45 or the strip line 46 by the switches 44 and 47.

In this manner, the phase rotation occurs instantaneously in the circuit which bypasses the transmission final stage amplifier 6 and 42 or in the circuit which controls the ON/OFF state of the LNA 25. However, the phase rotation can be prevented by providing a phase compensation circuit comprising the variable capacitance capacitor 9, the coil 8, the phase compensating circuit 27, the capacitor 43, and the coil 45 (or the strip line 46), and by supplying a data corresponding to the amount of the phase rotation in advance.

Therefore, the provision of the phase rotation compensating circuit permits prevention of the phase rotation even when a bypass circuit is used, in which the phase changes suddenly, and thus permits stable execution of radio communication.

As described above, according to the present invention, an advantageous effect is obtained that in the phase in which the amplifier is bypassed or the LNA is controlled to be ON or OFF, it is possible to prevent the phase rotation of the device output by providing a compensation circuit and by providing in advance previously the amount of phase rotation in a memory, and stable radio communication is attained.

What is claimed is:

1. A radio communication apparatus that transmits a signal, comprising:
   a power amplifier;
   a normal transmission route passing through the power amplifier;
   a bypass transmission route that bypasses said power amplifier; and
   a phase compensation circuit that is disposed in said bypass route and compensates for a sudden phase rotation in said signal when switching between said normal transmission route and said bypass transmission route.

2. A radio communication apparatus according to claim 1, wherein said phase compensation circuit includes a variable capacitor that changes a phase rotation when a predetermined control voltage is applied to said variable capacitor.

3. A radio communication apparatus according to claim 2, wherein said phase compensation circuit further includes at least one of a coil and a strip line, disposed in series with said variable capacitor.

4. A radio communication apparatus according to claim 3, further comprising a selection device that selects one of said coil and said strip line for a phase adjustment value of said phase compensation circuit.

5. A radio communication apparatus according to claim 2, further comprising a storage device that stores a phase adjustment value, which determines said predetermined control voltage that is applied to said phase compensation circuit to compensate for said sudden phase rotation.

6. A radio communication apparatus according to claim 1, wherein said phase compensation circuit includes a fixed capacitor and at least one of a coil and a strip line connected in series to said fixed capacitor.

7. A radio communication apparatus according to claim 6, wherein said phase compensation circuit further includes a selection device that selects one of said coil and said strip line.

8. A radio communication apparatus provided with a power amplifier, which can be bypassed, comprising:
   a normal route passing through the power amplifier and a bypass route for bypassing the power amplifier; and
   a phase compensation circuit, disposed in said bypass route, for compensating for a sudden phase rotation when switching between said normal route and said bypass route,
      wherein said phase compensation circuit adjusts a phase rotation by an amount by a control voltage, and
      wherein the radio communication apparatus comprises a storing device for storing a phase adjustment value for said phase compensation circuit.

9. A radio communication apparatus provided with a power amplifier, which can be bypassed, comprising:
   a normal route passing through the power amplifier and a bypass route for bypassing the power amplifier; and
   a phase compensation circuit, disposed in said bypass route, for compensating for a sudden phase rotation when switching between said normal route and said bypass route,
      wherein said phase compensation circuit comprises one of a coil and a strip line, and
      wherein the radio communication apparatus comprises a selection device for selecting a phase adjustment value by selecting one of the coil and the strip line.

10. A radio communication apparatus, comprising:
   a receiving amplifier that receives a radio signal;
   a phase compensation circuit, disposed downstream of said receiving amplifier, that compensates for a sudden phase rotation in said radio signal when said receiving amplifier is switched ON or OFF;
   a signal generator that adds a predetermined signal to said radio signal;
   a phase rotation measuring device that measures said sudden phase rotation based on said predetermined signal when said receiving amplifier is switched ON or OFF; and
   a power switch that selectively switches power ON or OFF to said receiving amplifier.

11. A radio communication apparatus, provided with a receiving amplifier whose power source is switched ON or OFF, an which is disposed on a receiving route,
   wherein the radio communication apparatus comprises a phase compensation circuit, disposed after said receiving amplifier on said receiving route, for compensating for a sudden phase rotation due to switching said power source ON or OFF,
   wherein an amount of phase rotation of said phase compensation circuit is variably controllable by a voltage, and
   wherein the radio communication apparatus comprises a memory device for storing a phase adjustment value for said compensation circuit.

12. A radio communication apparatus according to claims 10,
   wherein said phase compensation circuit comprises one of a coil and a strip line, and
   wherein said radio communication apparatus comprises a selection device for selecting the amount of the phase rotation by selecting one of said coil and said strip line.

13. A send and receive control system, comprising:
   a power amplifier that amplifies a transmission signal in a normal mode;
   a phase compensation circuit that is disposed in parallel to said power amplifier; and
   a route switch that selectively switches between said power amplifier and said compensation circuit in.a normal mode and a bypass mode, respectively,
      wherein said compensation circuit compensates for a sudden phase rotation in said transmission signal due to switching between said power amplifier and said compensation circuit.

14. A send and receive control system, comprising:
   a power amplifier that is selectively bypassed;
   a phase compensation circuit for compensating for a sudden phase rotation due to selectively switching a route switch between a normal route and a bypass route for bypassing said power amplifier,
      wherein an amount of phase rotation for said phase compensation circuit is controlled by a voltage, and
      wherein the send and receive control system comprises a memory device for storing a phase adjustment value for said phase compensation circuit.

15. A send and receive control system, comprising:
   a power amplifier that is selectively bypassed;
   a phase compensation circuit for compensating for a sudden phase rotation due to selectively switching a route switch between a normal route and a bypass route for bypassing said power amplifier,
      wherein said phase compensation circuit comprises one of a coil and a strip line and an amount of phase rotation is determined by selecting one of the coil and the strip line.

16. A send and receiv control system, comprising:
   a receiving amplifier, disposed on a receiving route, whose power source is selectively switched ON or OFF;
   a phase compensation circuit, disposed after said receiving amplifier, for compensating for a sudden phase rotation due to selectively switching said receiving amplifier ON or OFF; and a phase rotation measuring device that measures said sudden phase rotation based on a predetermined signal added to a radio signal received by said receiving amplifier.

17. A send and receive control system, comprising:

a receiving amplifier, disposed on a receiving route, whose power source is selectively switched ON or OFF;

a phase compensation circuit, disposed after said receiving amplifier, for compensating for a sudden phase rotation due to selectively switching said receiving amplifier ON or OFF,
wherein an amount of phase rotation of said phase compensation circuit is varied by a voltage, and a phase adjustment value for the phase compensation circuit is stored in a memory device.

18. A send and receive control system, comprising:

a receiving amplifier, disposed on a receiving route, whose power source is selectively switched ON or OFF;

a phase compensation circuit, disposed after said receiving amplifier, for compensating for a sudden phase rotation due to selectively switching said receiving amplifier ON or OFF,
wherein said phase compensation circuit includes one of a coil and a strip line, such that, an amount of phase rotation is selected by selecting one of said coil and said strip line.

19. A radio communication apparatus according to claim 11, wherein said phase compensation circuit comprises one of a coil and a strip line, and wherein said radio communication apparatus comprises a selection device for selecting an amount of phase rotation by selecting one of said coil and said strip line.

20. A method of phase compensation for a transmitted radio signal, comprising:

determining if said transmitted radio signal exceeds a threshold;

reading a phase adjustment value from a storage device, if said threshold is exceeded;

sending a control voltage based on said phase adjustment value to a variable capacitor of a phase compensation circuit; and switching a transmission amplifier OFF, after said variable capacitor is charged by said control voltage.

* * * * *